(12) United States Patent
Lee

(10) Patent No.: US 7,035,888 B2
(45) Date of Patent: Apr. 25, 2006

(54) DIGITAL SAMPLING RATE CONVERTER FOR COMPENSATION FOR DROP OF IN-BAND SIGNAL

(75) Inventor: Kyu-Ha Lee, Seoul (KR)

(73) Assignee: Samsung Thales Co., Ltd., (KR)

( * ) Notice: Subject to any disclaimer, the term of this patent is extended or adjusted under 35 U.S.C. 154(b) by 0 days.

(21) Appl. No.: 10/951,249

(22) Filed: Sep. 27, 2004

(65) Prior Publication Data

US 2005/0280564 A1  Dec. 22, 2005

(30) Foreign Application Priority Data

Jun. 22, 2004  (KR)  .................... 10-2004-0046779

(51) Int. Cl.
*G06F 17/17* (2006.01)
(52) U.S. Cl. .................... 708/313; 708/300
(58) Field of Classification Search .............. 341/61, 341/143, 140, 118; 708/300, 313, 319, 290, 708/301, 140, 118
See application file for complete search history.

(56) References Cited

U.S. PATENT DOCUMENTS

| | | | |
|---|---|---|---|
| 6,279,019 B1 * | 8/2001 | Oh et al. ............... | 708/300 |
| 6,643,675 B1 * | 11/2003 | Piirainen ............... | 708/313 |
| 2002/0150173 A1 * | 10/2002 | Buda ....................... | 375/316 |
| 2004/0107078 A1 * | 6/2004 | Chiu et al. ............... | 703/2 |

OTHER PUBLICATIONS

Hogenauer, "An Economical Class of Digital Filters for Decimation and Interpolation", IEEE Transactions on Acoustics, Speech, and Signal Process, vol. ASSP-29, No. 2, Apr. 1981, pp. 155-162.

Kwentus et al., "Application of Filter Sharpening to Cascaded Integrator-Comb Decimation Filters", IEEE Transactions on Signal Processing, vol. 45, No. 2, Feb. 1997, pp. 457-467.

Oh et al., "On the Use of Interpolated Second-Order Polynomials for Efficient Filter Design in Programmable Downconversion", IEEE Journal on Selected Areas in Communications, vol. 17, No. 4, Apr. 1999, pp. 551-560.

* cited by examiner

*Primary Examiner*—John B Nguyen
(74) *Attorney, Agent, or Firm*—Dilworth & Barrese LLP

(57) ABSTRACT

Disclosed is a digital sampling rate converter for compensating for a drop of an in-band signal, the digital sampling rate converter including a CIC (Cascaded Integrator-Comb) decimator for performing a decimation operation at a first decimation ratio based on an overall decimation ratio, for an input signal; a sub-decimator for performing a decimation operation at a second decimation ratio for a signal output from the CIC decimator; and a compensation unit for performing at least two multiplication operations and two addition operations with respect to a signal output from the sub-decimator using a lowest operation clock frequency in an assigned band.

3 Claims, 17 Drawing Sheets

DIGITAL SAMPLING RATE CONVERTER FOR COMPENSATION FOR DROP OF IN-BAND SIGNAL

PRIORITY

This application claims priority to an application entitled "Digital Sampling Rate Converter For Compensating For Droop Of In-Band Signal" filed in the Korean Intellectual Property Office on Jun. 22, 2004 and assigned Serial No. 2004-46779, the contents of which are hereby incorporated by reference.

BACKGROUND OF THE INVENTION

1. Field of the Invention

The present invention relates to a digital sampling rate converter for compensating for a drop of in-band signals, and more particularly to a digital sampling rate converter for compensating for a drop of the in-band signals which is caused during a digital down-conversion or a digital up-conversion of the digital signals.

2. Description of the Related Art

In a multiband multi-mode wireless communication system, various digital signal processing techniques have been developed to process certain signals, from methods constructed by hardware to a Software-Defined Radio (SDR) technique, which is a software wireless processing technique. In such a digital signal processing technique field, studies are actively progressing with regard to RF/IF (Radio Frequency/Intermediate Frequency) signal processing, which extracts narrow-band signals from wide-band signals.

Digital down-converters (DDCs) and digital up-converters (DUCs) are programmable and capable of high-speed signal processing, thereby requiring low power and a small number of operations to complete its processing.

FIG. 1 is a block diagram showing an example of a digital down-converter employing cascaded integrator-comb ("CIC") filters. The digital down-converter shown in FIG. 1 is a converter normally used in a receiver.

As shown in FIG. 1, the digital down-converter 10 includes a digital frequency synthesizer 16, multipliers 12 and 14, CIC decimation filters 20 and 30, sub-decimation filters 40 and 42, and down-samplers 46 and 48, and processes received signals which have been converted from analog signals into digital signals.

The respective down-sampled signals output from each of the down-samplers 46 and 48 of the digital down-converter 10 are signal-processed by a baseband signal processing unit 50 according to a predetermined processing method.

FIG. 2A is a detailed block diagram of one of the CIC decimation filters 20 or 30 shown in FIG. 1.

The CIC decimation filters 20 and 30 are filters proposed by E. B. Hogenauer, "*An Economical Class of Digital Filters For Decimation and Interpolation*", IEEE Transactions on Acoustics, Speech and Signal Processing, ASSP-29, No. 2, pp. 155–162, April 1981. The CIC decimation filter does not need a multiplier, requires only a small memory, and can be programmatically controlled.

As shown in FIG. 2A, each of the CIC decimation filters 20 and 30 includes an integration module 22, a down-sampler 24, and a comb filter module 26.

The integration module 22 comprises a plurality of integrators, each of which includes an adder ($22a$ to $23a$), a delay unit ($22b$ to $23b$), and a scaler ($22c$ to $23c$).

Each of the integrators performs an integration operation with respect to an input digital signal by Equation 1.

$$H_i(z) = \frac{1}{1 - z^{-1}} \quad (1)$$

where '$z^{-1}$' represents a delay value with respect to each of the delay units $22b$ and $23b$.

Therefore, an operation of the integration module 22 may be represented by Equation 2:

$$H_I(z) = \left(\frac{1}{DM} H_i(z)\right)^N = \left(\frac{1}{DM} \frac{1}{1-z^{-1}}\right)^N \quad (2)$$

where 'M' is a decimation ratio, and 'D' is a differential delay value of the comb filter module 26.

The down-sampler 24 performs a down-sampling operation with respect to a signal which is output from the scaler $23c$ accommodated in the integrator of the last stage in the integration module 22.

The comb filter module 26 comprises a plurality of comb filters, each of which includes a delay ($26a$ to $27a$) and an adder ($26b$ to $27b$).

Each of the comb filters performs a filtering operation as shown in Equation 3.

$$H_c(z) = 1 - z^{-1} \quad (3)$$

Therefore, an operation of the comb filter module 26 may be represented by Equation 4.

$$H_c(z) = (1 - z^{-DM})^N \quad (4)$$

Accordingly, a transfer function of the whole CIC decimation filter 20 may be represented by Equation 5.

$$H(z) = H_I(z) H_c(z) = \left(\frac{1}{DM} \frac{1 - z^{-DM}}{1 - z^{-1}}\right)^N \quad (5)$$

The '1/DM', which is a scaling factor of the respective scalers $22c$ to $23c$, is a value for compensating for a DC gain. Therefore, a frequency response spectrum of the CIC decimation filter 20 may be represented by Equation 6.

$$H(e^{j\omega}) = \left\{ \frac{\sin\frac{\omega DM}{2}}{DM \sin\frac{\omega}{2}} e^{-j\omega[(DM-1)/2]} \right\}^N \quad (6)$$

Such a CIC decimation filter 20 does not need a multiplier, requires only a small memory, and can be controlled by software. CIC decimation filters are widely used to separate an aliasing component and an image component of a signal. However, CIC decimation filters have spectrum characteristics of the form of a sinc function. Therefore, a drop of an in-band signal causes the distortion of the signal spectrum, so that it is necessary to compensate for such drop.

FIG. 2B is a detailed block diagram showing a CIC decimation filter employed in a transmitting party.

The CIC decimation filter employed in a transmitting party, as shown in FIG. 2B, is referred to as "a CIC interpolation filter". Also, a converter accommodated in a transmitter employing the CIC interpolation filter is referred to as "a digital up-converter (DUC)".

Referring of FIG. 2B, the CIC interpolation filter includes a comb filter module 66, an up-sampler 64, and an integration module 62.

The comb module 66 comprises a plurality of comb filters, each of which includes a delay 66a to 67a and an adder 66b to 67b.

The up-sampler 64 performs an up-sampling operation with respect to a signal which is output after the repeated delays and addings of the comb filter module 66.

The integration module 62 comprises a plurality of integrators, each of which includes an adder 62a to 63a, a delay 62b to 63b, and a scaler 62c to 63c.

FIG. 3 is a graph showing a frequency response spectrum of the CIC decimation filter 20.

As shown in FIG. 3, since the CIC decimation filter 20 causes the generation of nulls at integer multiplies of 1/M, it is possible to remove an aliasing component and an image component. In addition, the stopband attenuation of the CIC decimation filter 20 has a value equal to or greater than the peak value of sidelobe.

Referring to FIG. 3, the attenuation of the aliasing or the image component is 67.8 dB, and the stopband attenuation is 51.2 dB, which represents an efficient status. The CIC decimation filter 20 exhibits desirable characteristics, such as small hardware, a small number of operations, and a requirement of a small memory capacity, but has a narrow pass band due to a wide transfer band, thereby being used in a multi-stage decimation structure.

Since a decimation ratio in the stage following the CIC decimation filter 20 is how, the drop of the in-band signals that is caused in the CIC decimation filter 20 must be compensated for.

In order to compensate for the attenuation caused by such a sinc function, designing an approximate compensation filter using a window method is generally used. In addition, studies have been made with respect to improving the attenuation caused by the sinc function using multistage CIC filters having identical characteristics. One such method is disclosed by A. Y Kwentus, Z. Jiang, and A. N. Wilson, *"Application of filter sharpening to cascaded integrator-comb decimation filters"*, IEEE Trans. Sig. Proc., Vol. 45, No. 2, pp. 457–467, February 1997, and a method of using an interpolated second-order linear filter is disclosed by H. J. Oh, G. C. Choi, and Y. H. Lee, *"On the use of interpolated second-order polynomials for efficient filter design in programmable down conversion"*, IEEE J. Selec. Areas Comm., pp. 551–560, Vol. 17, No. 4, April 1999.

To construct a compensation filter using the window method, a baseband compensation filter is used, but since the compensation filter is a twelfth or higher order filter, the filter has twelve taps or more, so that a large number of multiplication operations and addition operations are required.

By improving the attenuation using multistage CIC filters having identical characteristics, an excellent spectrum characteristic is exhibited in band and in a stopband, but the compensation operation is performed at the highest sampling rate equal to an operation clock of a CIC filter, thereby being performed by a clock of the highest frequency. The compensation operation must be performed at a high speed.

By using an interpolated second-order linear filter, a compensation function may be realized with a simple second-order structure, but a clock frequency higher than that of a baseband is required to operate the compensation filter because a compensation filter must be located at the stage directly next to a CIC filter. Also, since it is required for filters to have symmetrical structures to each other and a spectrum representing a characteristic of an interpolated filter exhibits repeated waves, it is possible to compensate for in-band attenuation, but the stopband attenuation becomes worse.

SUMMARY OF THE INVENTION

Accordingly, the present invention has been made to solve at least the above-mentioned problems occurring in the prior art, and an object of the present invention is to provide a digital sampling rate converter, which can reduce the required number of operations, and minimize an effect of the stopband attenuation while compensating for an attenuation phenomenon caused in a signal band of a sinc function in a CIC (Cascaded Integrator-Comb) filter.

To accomplish this object, in accordance with one aspect of the present invention, there is provided a digital sampling rate converter for compensating for a drop in an in-band signal, the digital sampling rate converter including a CIC (Cascaded Integrator-Comb) decimator for performing a decimation operation at a first decimation ratio for an input signal; a sub-decimator for performing a decimation operation at a second decimation ratio, and a compensation unit for performing at least two multiplication operations and two addition operations with respect to a signal output from the sub-decimator using a lowest operation clock frequency in an assigned band.

In accordance with another aspect of the present invention, there is provided a digital sampling rate converter for compensating for a drop in an in-band signal, the digital sampling rate converter including a compensation unit for performing at least two multiplication operations and two addition operations with respect to an input signal using an operation clock frequency; an interpolator for interpolating at a first interpolation ratio, a signal output from the compensation unit; and a CIC (Cascaded Integrator-Comb) interpolator for interpolating at a second decimation ratio a signal output from the interpolator.

According to the digital sampling rate converter of the present invention, since a linear compensation filter is constructed as a second-order filter for processing signals of a baseband of the digital down/up converter (decimator/interpolator), it is possible to operate at a clock speed of the lowest frequency, and only a two-tap memory is required, which is able to operate at a low speed, with a small number of operations, and using few resources.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Figure 1:
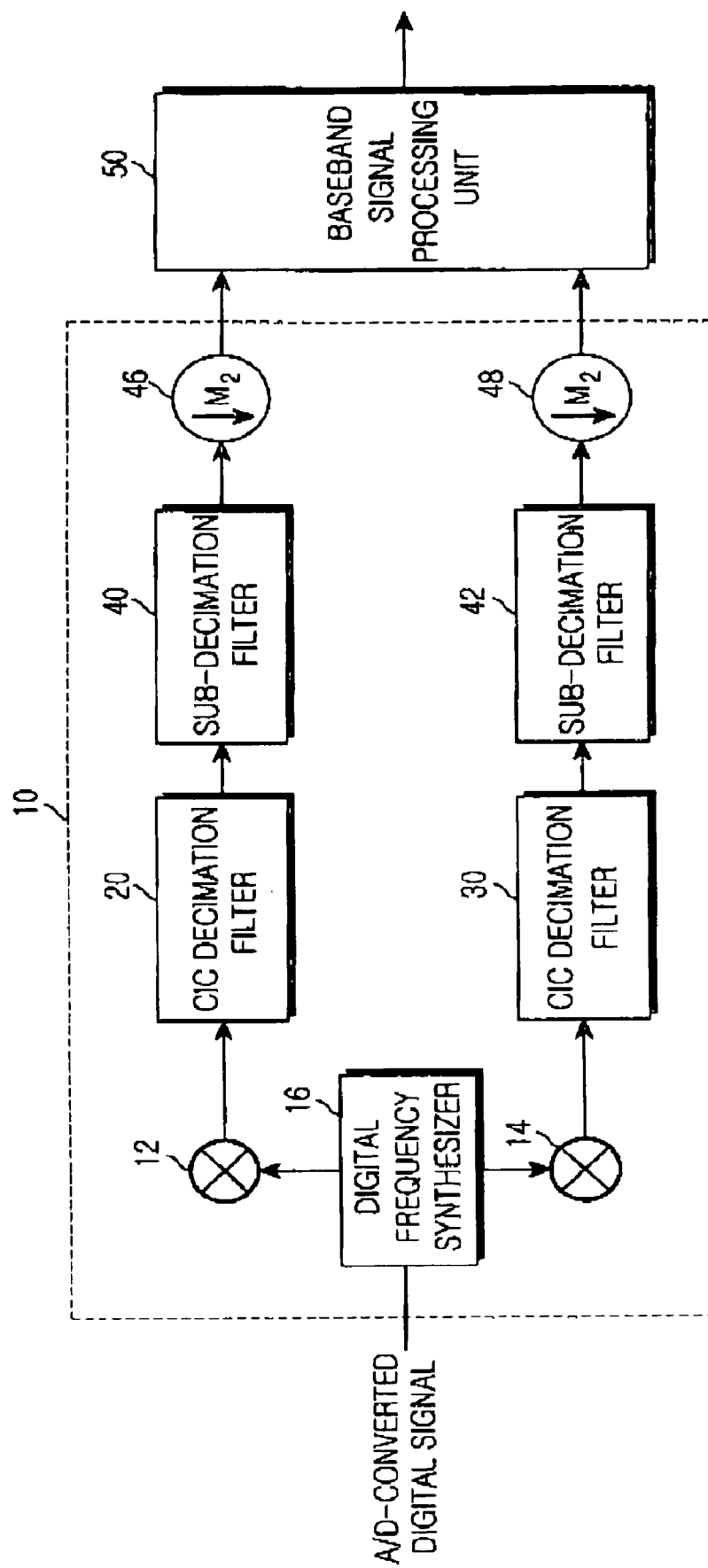
FIG. 1 is a block diagram showing an example of a digital down-converter employing a CIC filter.

Hereinafter, preferred embodiments according to the present invention will be described with reference to the accompanying drawings. It is to be noted that the same elements are indicated with the same reference numerals throughout the drawings. Although a number of specific features, such as specific components of a circuitry, are given below, they are presented for a better understanding of the present invention only. Also, it will be clear to those skilled in the art that the present invention can be practiced without such specific features. In the following description of the present invention, a detailed description of known functions and configurations incorporated herein will be omitted when it may obscure the subject matter of the present invention.

Figure 4:
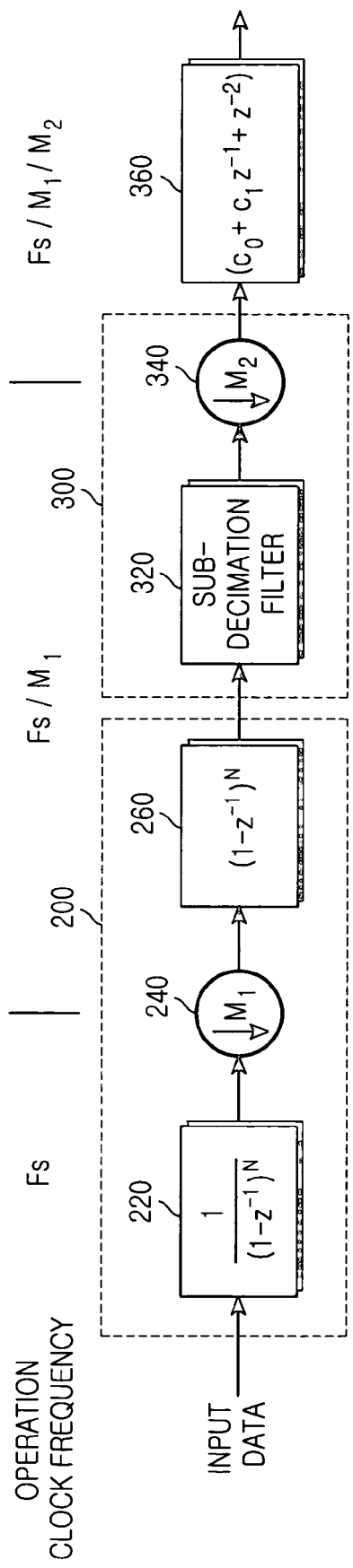
FIG. 4 is a block diagram showing a decimator which is applied to a digital signal converter for compensating for signal attenuation caused in a signal band of a sinc function during a digital signal conversion, according to one embodiment of the present invention.

FIG. 4 is a block diagram showing a decimator which is applied to a digital signal converter for compensating for the signal attenuation caused in a signal band of a sinc function, according to one embodiment of the present invention. That is, FIG. 4 shows an example of a decimator accommodated in a receiver.

A digital signal converter employing the decimator shown in FIG. 4 is defined as a digital down-sampling rate converter. In the following description, "digital down-sampling rate converter" and "decimator" are used synonymously, and are regarded as performing the same function.

The decimator of the digital signal converter according to the present invention employs a second-order filter to compensate for a drop in the in-band signals which is caused by the spectrum characteristic of a sinc function.

The second-order filter is designed to be approximately linear in phase. The second-order filter according to the present embodiment is designed to operate at a minimum clock frequency, and performs only two multiplication operations and two addition operations. In the following description of the present invention, the second-order filter is referred to as an approximately linear compensation filter.

First, the operation of the decimator shown in FIG. 4 will be briefly described. Referring to FIG. 4, the decimator according to one embodiment of the present invention includes a CIC (Cascaded Integrator-Comb) decimator 200, a sub-decimator 300, and a linear compensation filter 360.

The CIC decimator 200 performs a decimation operation on an input signal at a first decimation ratio which is based on a part of the overall decimation ratio.

The sub-decimator 300 performs a decimation operation with respect to a signal output from the CIC decimator 200, at a second decimation ratio.

The linear compensation filter 360 performs two multiplication operations and two addition operations on the signal output from the sub-decimator 300, using a minimum clock frequency in an assigned band. The linear compensation filter 360 compensates for a frequency response characteristic of the attenuation caused in a sinc function, and exhibits linear phase characteristics.

The CIC decimator 200 includes an integration module 220 having N integrators, a down-sampler 240, and a comb filter module 260 having N comb filters. The sub-decimator 300 includes a sub-decimation filter 320 and a down-sampler 340.

Figure 2A:
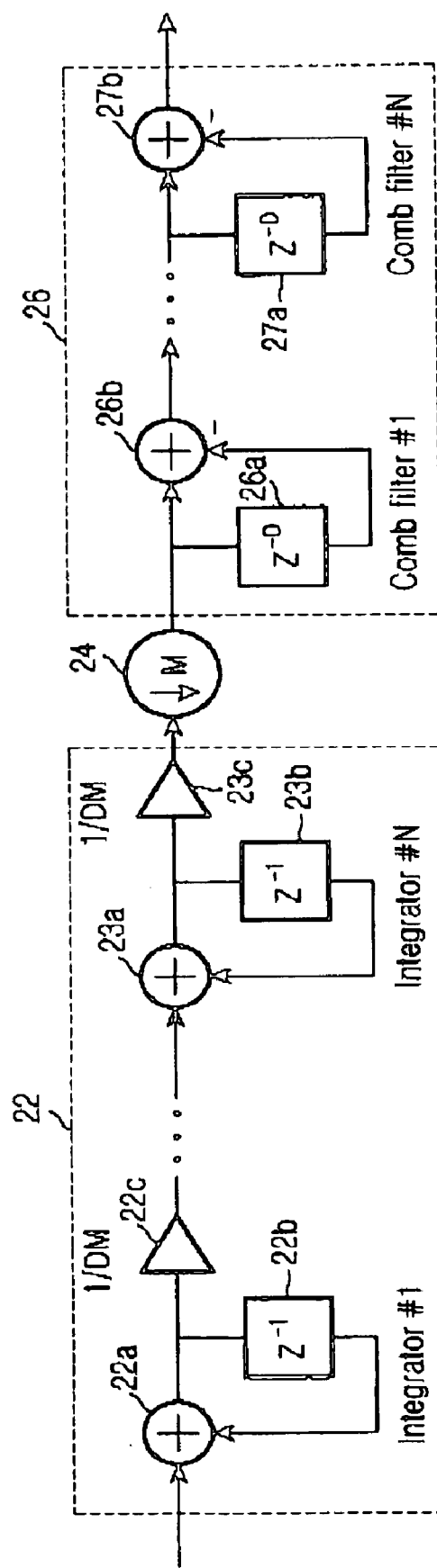
FIG. 2A is a detailed block diagram of a CIC decimation filter shown in FIG. 1.
Figure 2B:
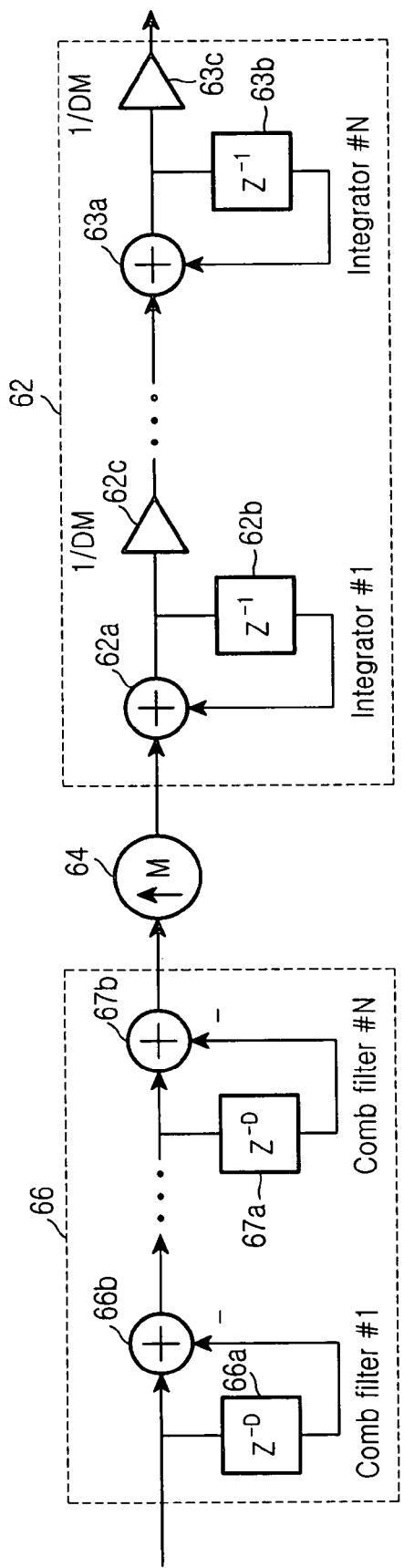
FIG. 2B is a detailed block diagram showing a CIC decimation filter employed in a transmitting party.
Figure 3:
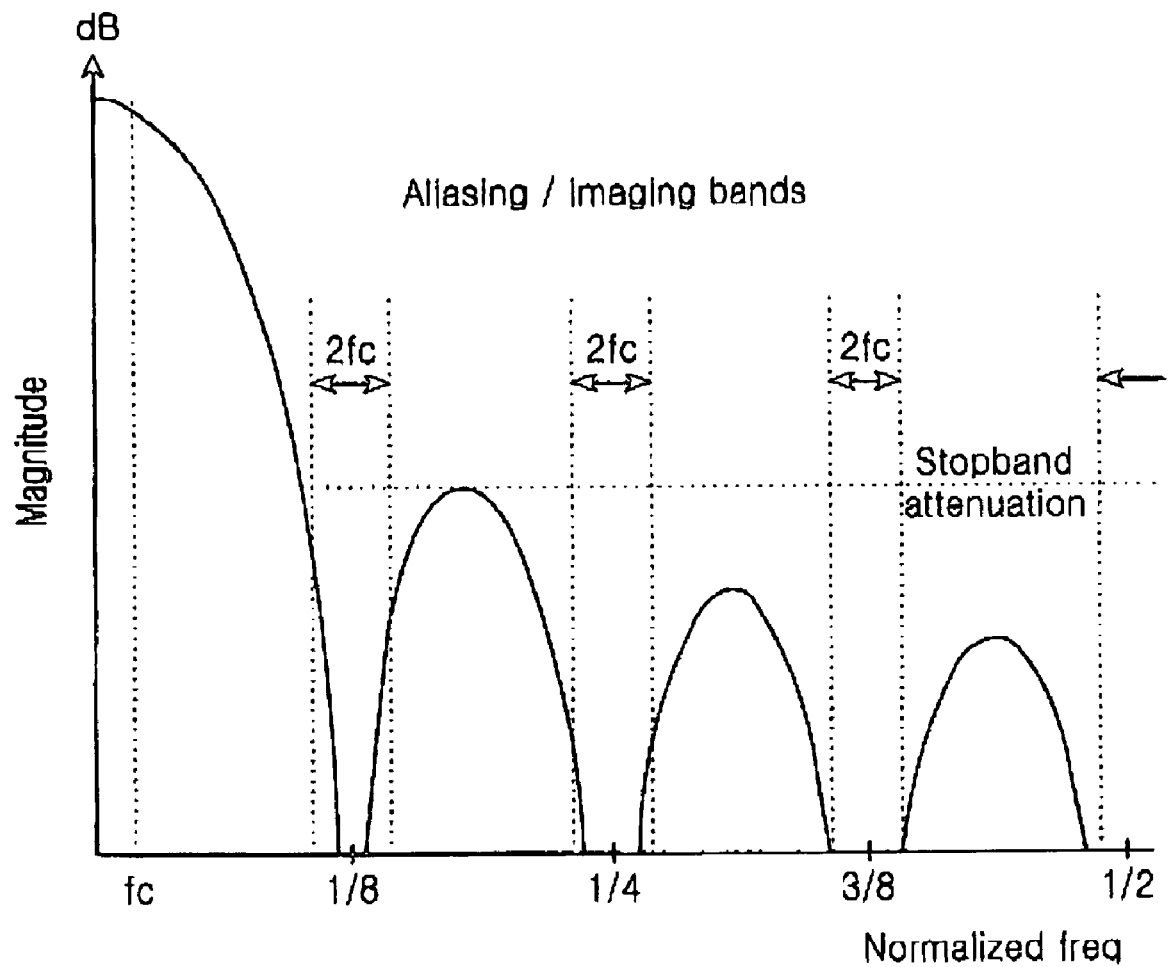
FIG. 3 is a graph showing a frequency response spectrum of a CIC decimation filter.

The integration module 220, the down-sampler 240, and the comb filter module 260, which are included in the CIC decimator 200, have the same constructions and operations as corresponding components of a CIC decimation filter 20 shown in FIGS. 1 and 2, therefore, a detailed description of these components will be omitted. Also, the sub-decimation filter 320 and the down-sampler 340 included in the sub-decimator 300 performs the same operations as a sub-decimation filter 40 and a down-sampler 46, respectively, shown in FIGS. 1 and 2, therefore, a detailed description of these components will also be omitted.

The linear compensation filter 360 is located at an output terminal of the down-sampler 340.

A transfer function ($H_{ALC}(Z)$) of the linear compensation filter 360 according to the present invention is defined by Equation 7.

$$H_{ALC}(Z) = \frac{1}{|C_0 + C_1 + 1|}(C_0 + C_1 Z^{-1} + Z^{-2}) \quad (7)$$

The linear compensation filter 360 has the same property as that of a second-order finite impulse response (FIR) filter.

In Equation 7, each of '$C_0$' and '$C_1$' is a real number, and the transfer function has a range satisfying the following conditions:

First condition: A frequency magnitude response has a form of an increasing function;

Second condition: A passband ($f_p$) is within the range of the transfer function; and Third condition: A group delay in the passband is within the range of the transfer function.

In the following description, the above-mentioned conditions will be described in detail.

1. The first condition: A frequency magnitude response has a form of an increasing function.

In order for the frequency magnitude response according to the transfer function ($H_{ALC}(Z)$) of the linear compensation filter 360 to have an increasing function in the entire band of 0 to $\pi$, it is necessary to satisfy Equation 8.

$$|H_{ALC}(e^{j0})| < |H_{ALC}(e^{j\pi})| \quad (8)$$

And if the condition of Equation 9 is satisfied.

$$|C_0 + C_1 + 1| < |C_0 - C_1 + 1| \quad (9)$$

Equation 10 can be obtained.

If $C_1 < 0, C_0 > -1$, and if $C_1 > 0, C_0 < -1$.  (10)

2. The second condition: A passband ($f_p$) is within the range of the transfer function.

Frequency magnitudes ($\delta_l$ and $\delta_h$) of the linear compensation filter 360 are determined by an error range of the frequency magnitudes of a compensated passband. Therefore, the frequency magnitudes ($\delta_l$ and $\delta_h$) of the linear compensation filter 360 must satisfy Equation 11.

$$\delta_l \le |H_{ALC}(e^{j\pi})| \le \delta_h, \text{ so that}$$

$$\delta_l \le \left|\frac{|C_0 - C_1 + 1|}{|C_0 + C_1 + 1|}\right| \le \delta_h.$$  (11)

3. The third condition: A group delay in the passband is within the range of the transfer function.

In order to satisfy the third condition, the group delay can be represented as Equation 12 by using a zero component existing in '$z = re^{j\theta}$' and '$z = re^{-j\theta}$'.

$$-\frac{d\angle H_{ALC}(e^{j\theta})}{d\omega} = \frac{r^2 - r\cos(\omega - \theta)}{1 + r^2 - 2r\cos(\omega - \theta)} + \frac{r^2 - r\cos(\omega + \theta)}{1 + r^2 - 2r\cos(\omega + \theta)}$$  (12)

When a group delay caused during a band-pass has a value within a range of '$+\delta_d$' and '$-\delta_d$', the ranges of '$C_0$' and '$C_1$' are calculated to satisfy Equation 13.

$$\left|\frac{2C_0 - C_1}{1 + C_0 - C_1} - \frac{2C_0 + C_1}{1 + C_0 + C_1}\right| \le \delta_d$$  (13)

Figure 5:
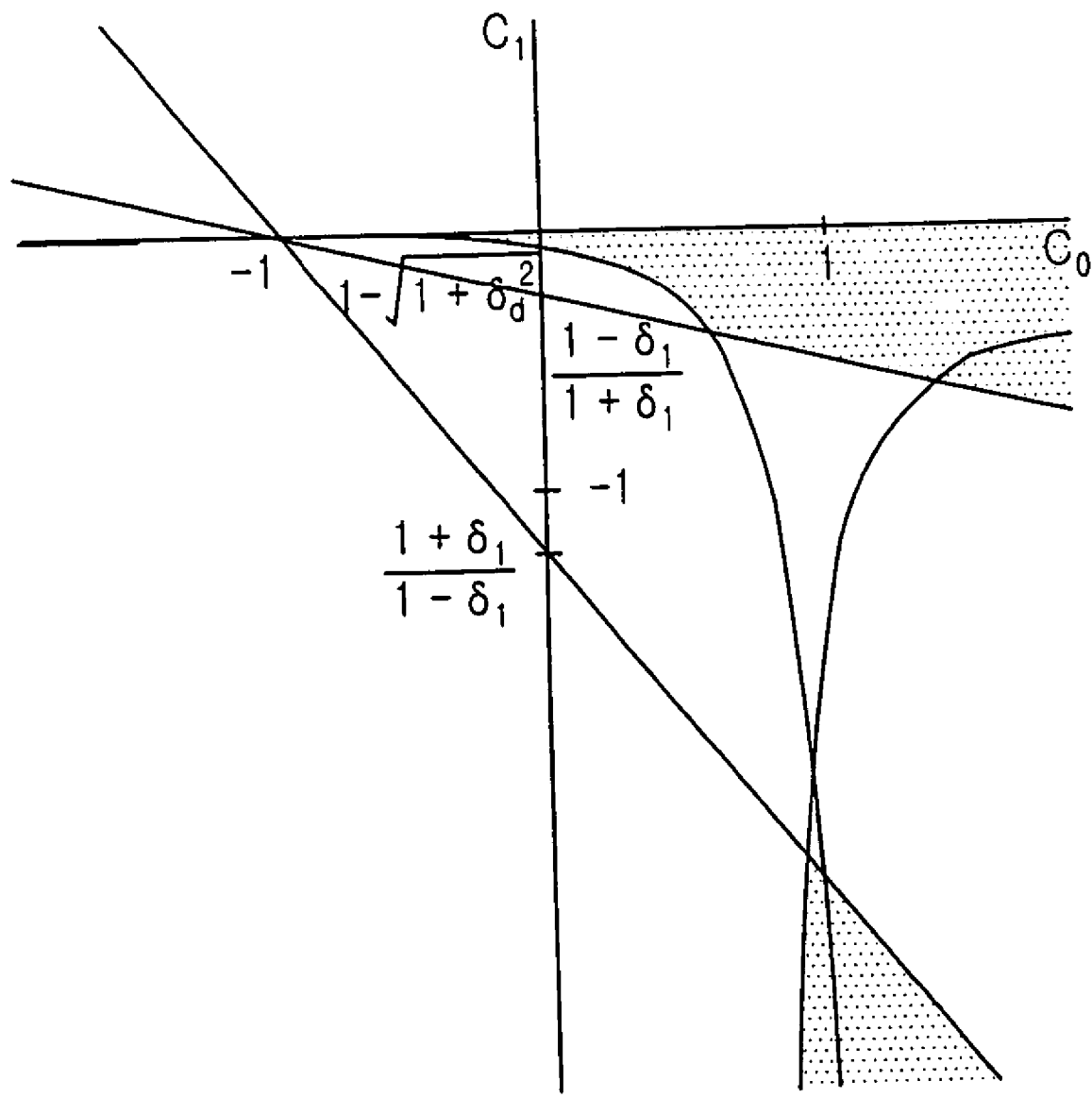
FIG. 5 is a graph showing ranges of '$C_0$' and '$C_1$'.

Therefore, according to the first, second, and third conditions, it can be understood that the ranges of '$C_0$' and '$C_1$' exist on a plane as shown in FIG. 5.

Optimal values of '$C_0$' and '$C_1$' to minimize a frequency magnitude error can be obtained by the three conditions, so that the linear compensation filter 360 satisfying the three conditions can be designed.

In the present embodiment, the optimal values of the linear compensation filter 360 are obtained from Equation 14 which has been modified from a min-max algorithm. The algorithm is designed to obtain the optimal values, while maintaining the phase characteristic in a linear form as much as possible and compensating for a frequency characteristic.

If $E_M(c) > \varepsilon$, $\underset{c}{\text{minimize}}\ E_M(C)$, and  (14)

if not, $\underset{c}{\text{minimize}}\ E_G(C)$, where, $E_M(c) = \max|e_M(c)| - \min|e_M(c)|,$ $E_G(c) = \max|e_G(c)| - \min|e_G(c)|,$ $E_M(c, \omega_i) = |H(\omega_i) H_{ALC}(c, \omega_i)|,$ $e_G(c, \omega_i) = -\frac{d\angle\{H(\omega_i) H_{ALC}(e, \omega_i)\}}{d\omega},$ and $c = [c_0, c_1]$ The linear compensation filter 360 designed as above is disposed at the last stage in the decimator, as shown in FIG. 4, so as to use the optimal values of the linear compensation filter 360 as coefficients of an FIR filter.

Figure 6:
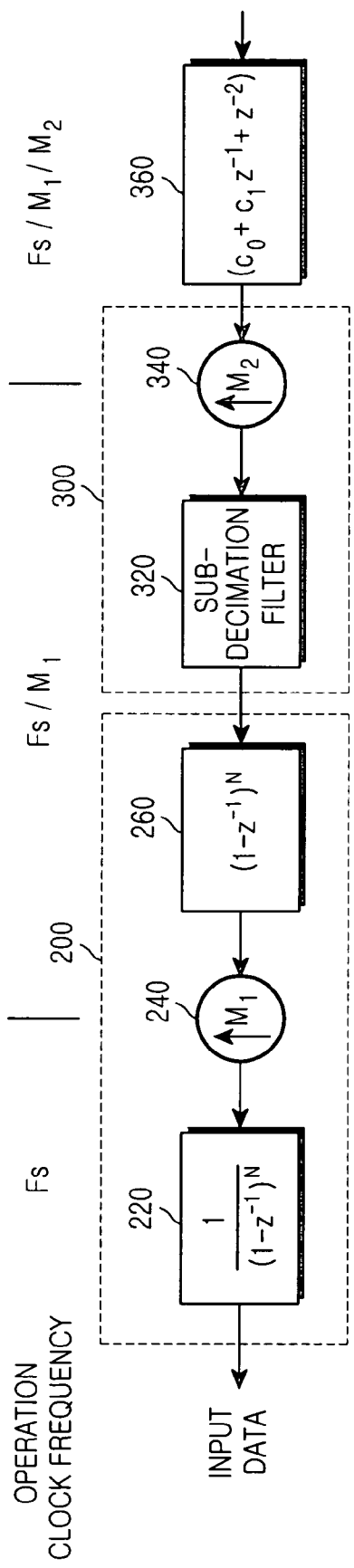
FIG. 6 is a block diagram showing an example of a decimator in which the decimator shown in FIG. 4 is applied in a transmitter.

FIG. 6 is a block diagram showing an example of a decimator in which the decimator shown in FIG. 4 is applied in a transmitter.

A digital down-sampling rate converter accommodated in a transmitter, as shown in FIG. 6, is referred as a 'digital up-sampling rate converter'.

The digital up-sampling rate converter shown in FIG. 6 performs a reverse operation to the digital down-sampling rate converter shown in FIG. 4, with respect to the input signals.

The linear compensation filter 360 performs two multiplication operations and two addition operations with respect to an input signal using an operation clock frequency.

An interpolator 300 interpolates a signal outputted from the linear compensation filter 360, at a first interpolation ratio which is based on a part of an overall interpolation ratio.

A CIC interpolator 200 interpolates a signal output from the interpolator 300, at a second interpolation ratio.

Figure 7:
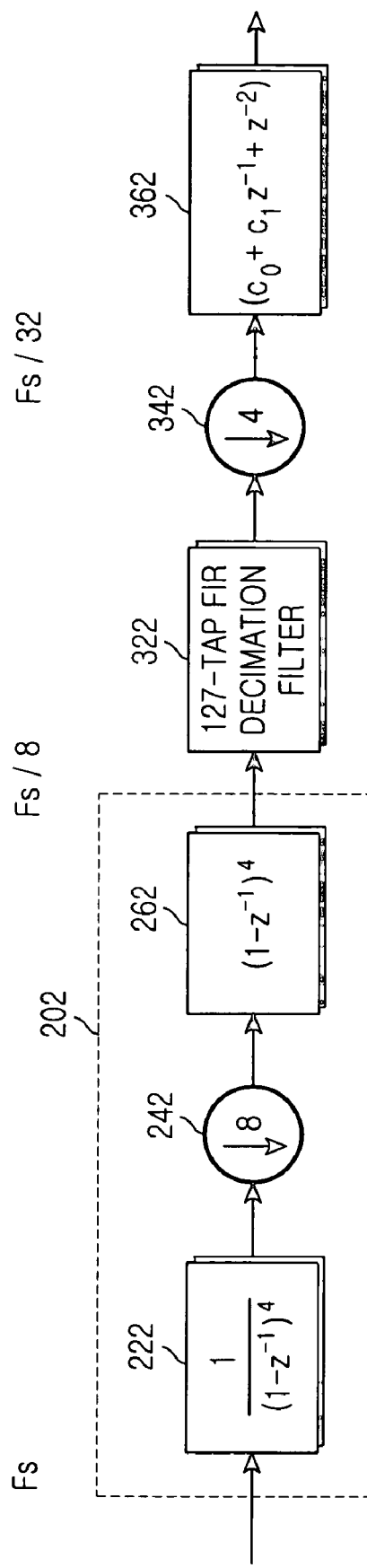
FIG. 7 is a block diagram showing an example of a decimator designed using the decimator shown in FIG. 4.

FIG. 7 is a block diagram showing an example of a decimator designed using the decimator shown in FIG. 4.

Operation values of the decimator shown in FIG. 7 are as follows:

Overall Decimation Ratio (M): 32;
Decimation Ratio ($M_1$) in CIC decimation filter: 8;
Decimation Ratio ($M_2$) in next stage: 4;
Passband Freq.: 0.0144 Fs;
Stopband Freq.: 0.0169 Fs;
Passband Ripple: 0.3 dB; and
Stopband Attenuation: 50 dB.

A decimator, that is, a digital down-converter, designed according to the above-mentioned conditions is shown in FIG. 7.

A decimation filter 202 performs a decimation operation in a ratio of 8:1 for the overall decimation ratio of 32:1. A 127-tap FIR decimation filter 322 performs a decimation operation in a ratio of 4:1 with respect to a signal output from the decimation filter 202.

The decimation filter 202 is designed as a fourth order (N=4) filter and with one delay (D=1). Therefore, the decimator filter 202, which causes a monotonic decrease at a passband, causes a maximum attenuation of 0.88 at a passband frequency ($f_p$). To this end, a compensation filter proposed to operate at a base sampling rate is designed to have coefficients as shown in Equation 15.

$$c = [c_0, c_1]$$  (15)

$$= [0.0170, -0.0430]$$

Figure 8:
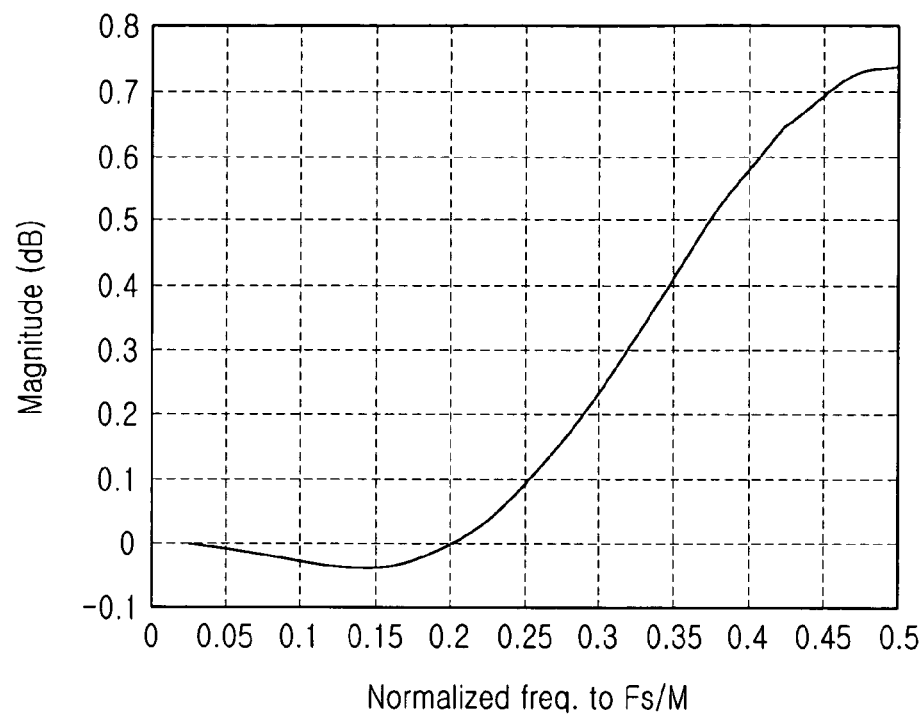
FIG. 8 is a graph showing a frequency response characteristic of the decimator shown in FIG. 7.
Figure 9:
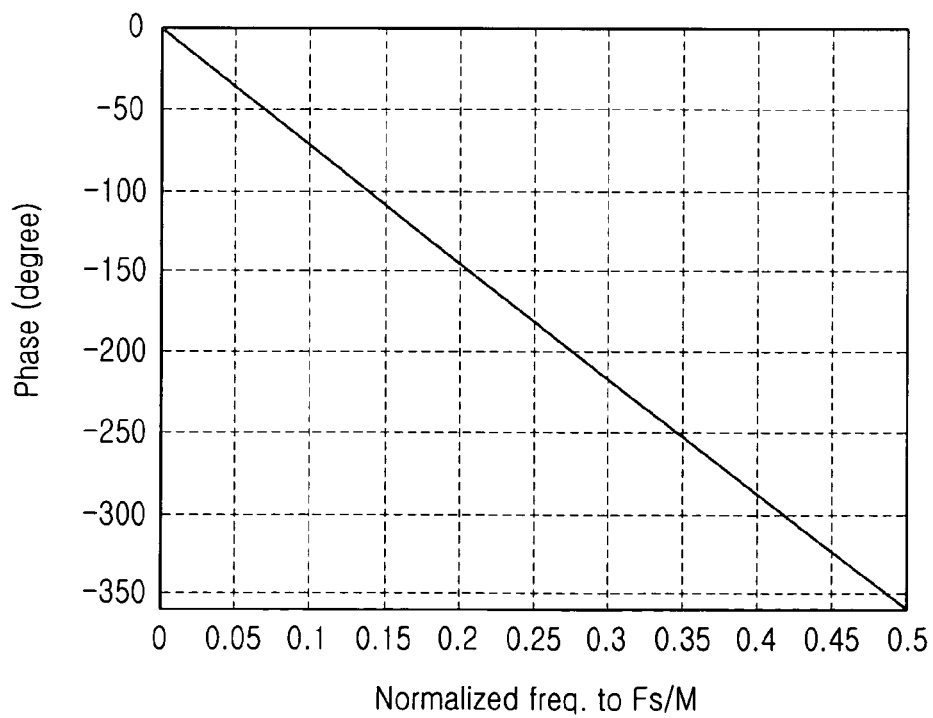
FIG. 9 is a graph showing a phase characteristic of the decimator shown in FIG. 7.

FIG. 8 is a graph showing a frequency response characteristic of the decimator shown in FIG. 7, and FIG. 9 is a graph showing a phase characteristic of the decimator shown in FIG. 7.

As shown in FIG. 8, the decimator of FIG. 7 has a frequency response characteristic of an increasing function, which is an inverse function to the response of the decimation filter 202.

As shown in FIG. 9, the decimator of FIG. 7 has a phase characteristic of an linear form. Therefore, its delay group has a 0.1 sample rate in maximum.

Figure 10A:
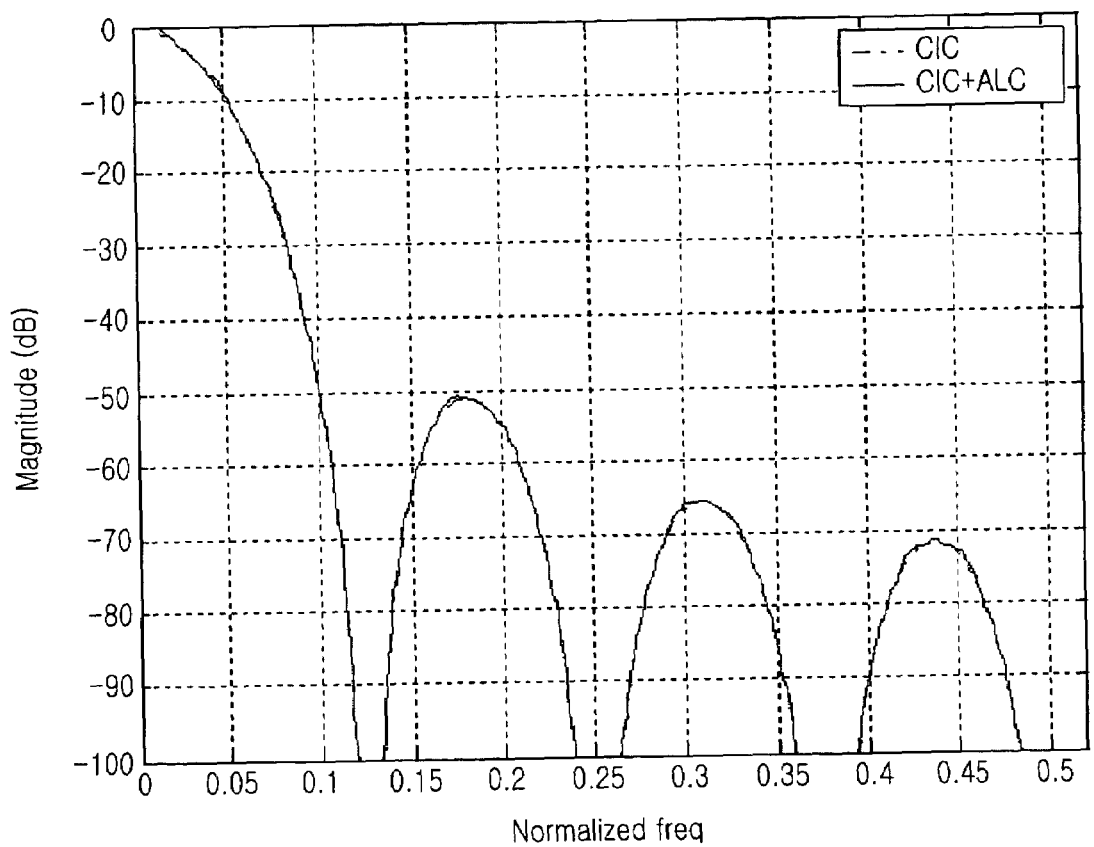
FIGS. 10A and 10B are graphs showing a comparison of the frequency response characteristics between a decimation filter according to the present invention and the conventional CIC decimation filter.
Figure 10B:
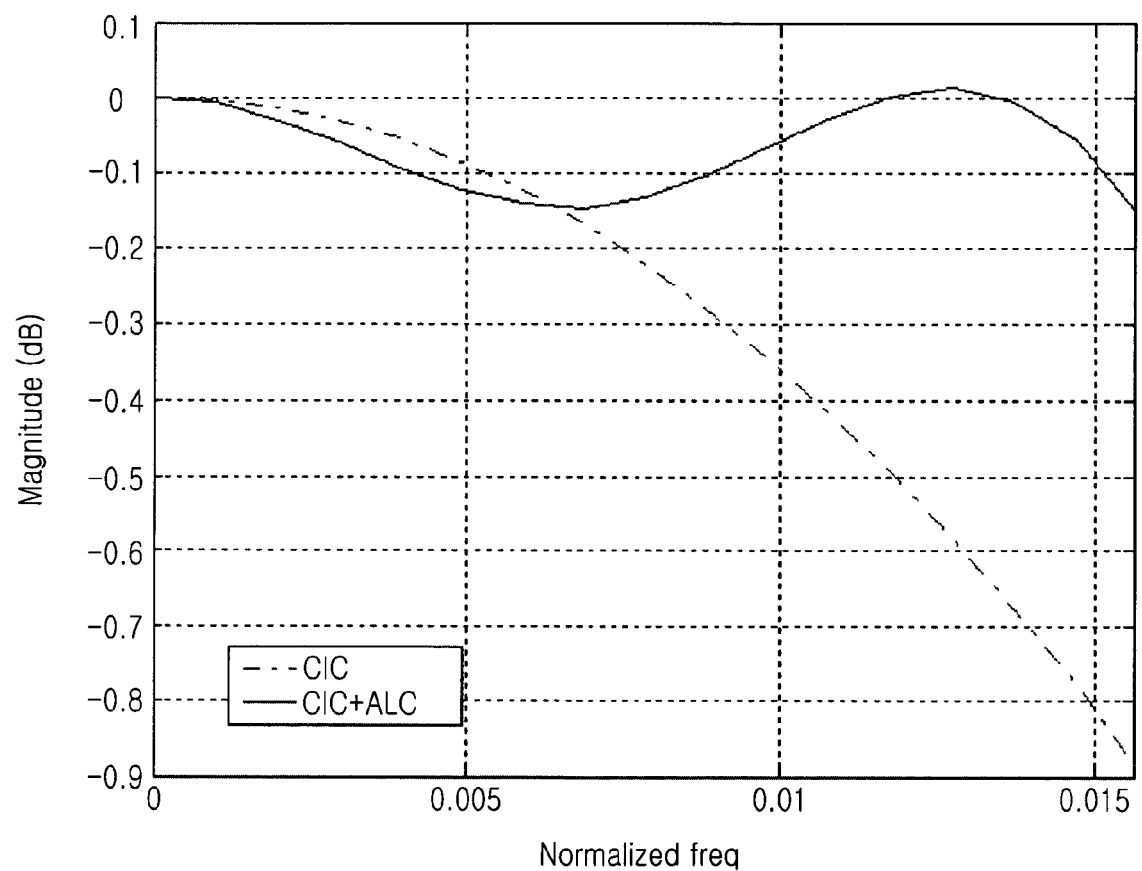

FIGS. 10A and 10B are graphs showing a comparison of frequency response characteristics between a decimation filter according to the present invention and the conventional CIC decimation filter.

Referring to FIG. 10A, it can be understood that the change of the stopband attenuation in the decimator of the present invention is very small, unlike that of the conventional CIC decimation filter. Referring to FIG. 10B, it can be understood that a drop phenomenon in a passband is further compensated for, as compared with the conventional CIC decimation filter. A ripple occurs in the passband according to the compensated frequency response, but it exerts no effect upon the operation of the digital converter because the ripple has a value equal to or less than 0.3 dB.

Figure 11A:
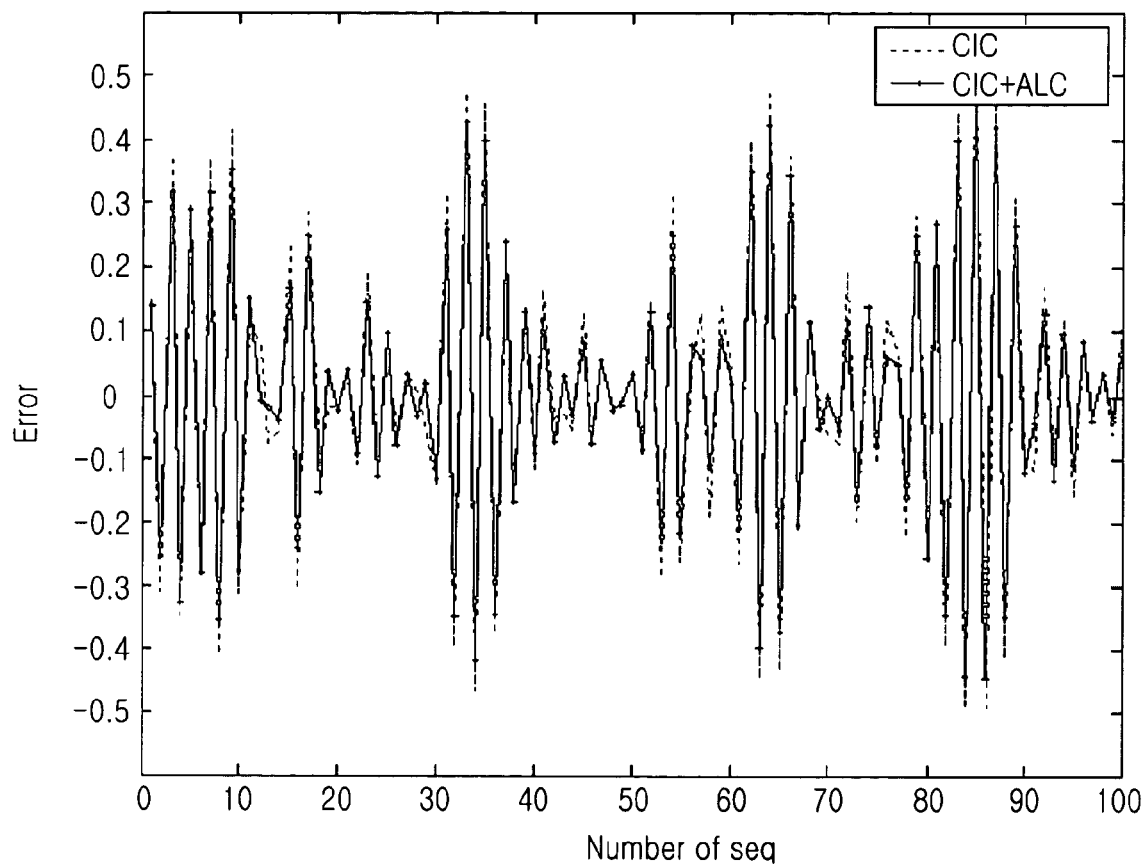
FIGS. 11A, 11B, and 12 are graphs showing simulation results of a modulation method having a phase difference of '$\pi$', using the decimation filter according to the present invention and a CIC decimation filter.
Figure 11B:
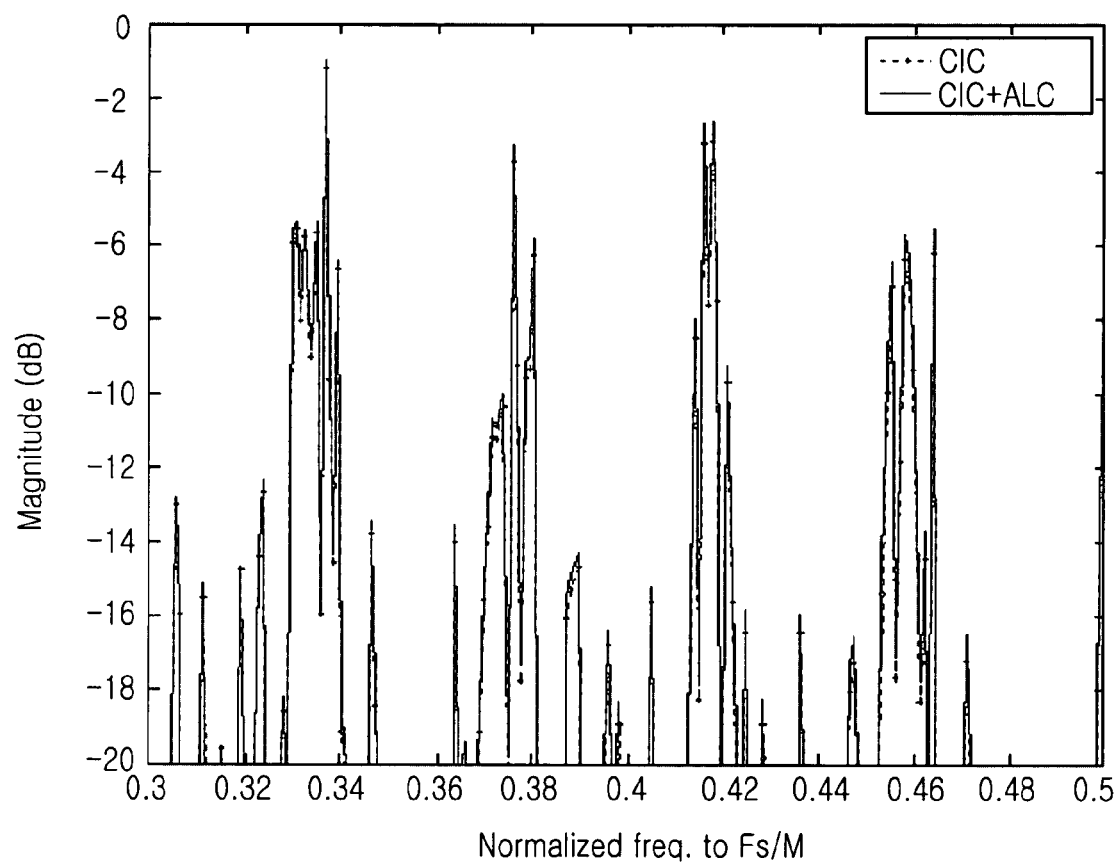
Figure 12:
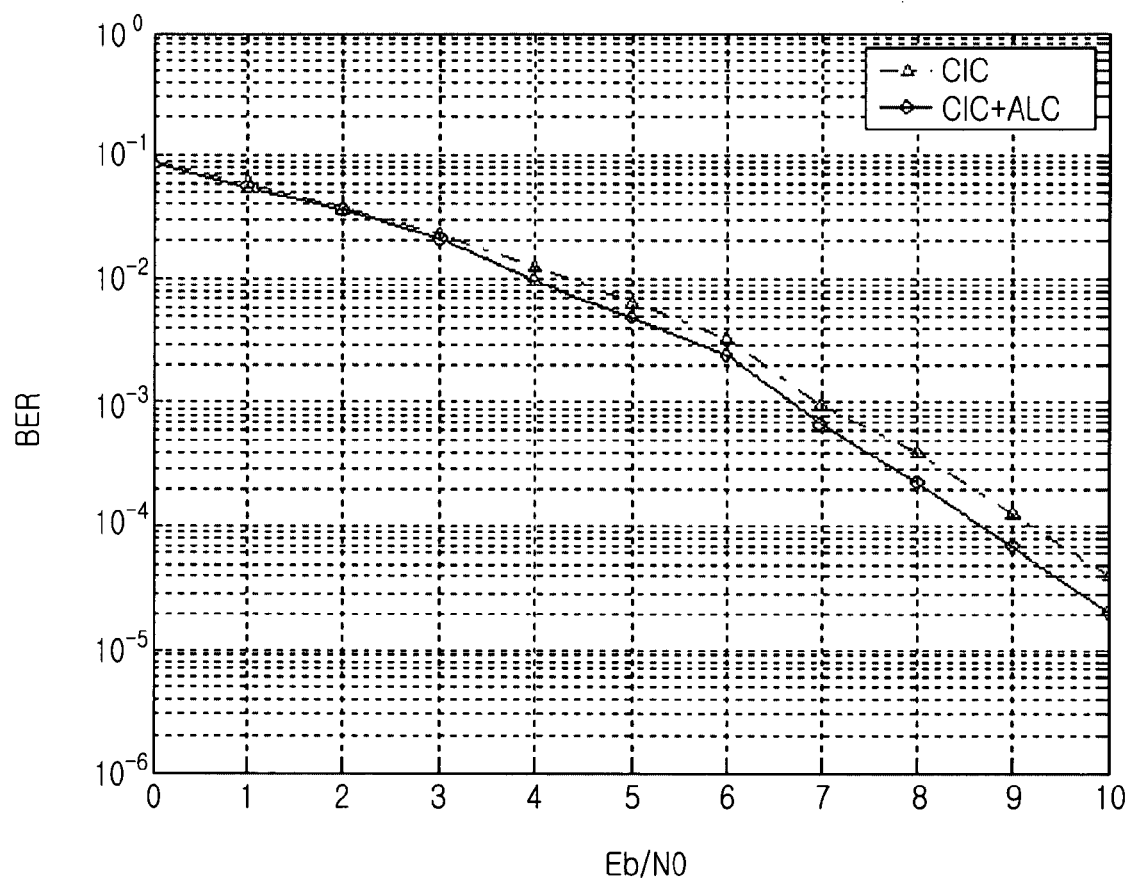

FIGS. 11A, 11B, and 12 are graphs showing simulation results of a modulation method having a phase difference of 'π', using the decimation filter according to the present invention and a CIC decimation filter.

FIGS. 11A and 11B are graphs for showing a difference between a transmitted value and a demodulated value in the final receiving stage, with respect to a raised cosine signal transmitted under identical channel conditions having no noise, in which FIG. 11A shows a spectrum based on a time range, and FIG. 11B shows a spectrum based on a frequency range.

As a result of the simulation, it can be understood that the digital converter according to the present invention has an improved performance by 10.8% in the time range, and compensates for attenuation in the frequency range.

FIG. 12 is a graph showing error probabilities of the decimator of the present invention and the conventional CIC decimation filter under a white noise environment. As shown in FIG. 12, under the white noise environment, as a signal-to-noise ratio is increased, the performance of the decimation filter becomes even more improved, and the error probabilities are improved by 24.1% on the average.

Figure 13A:
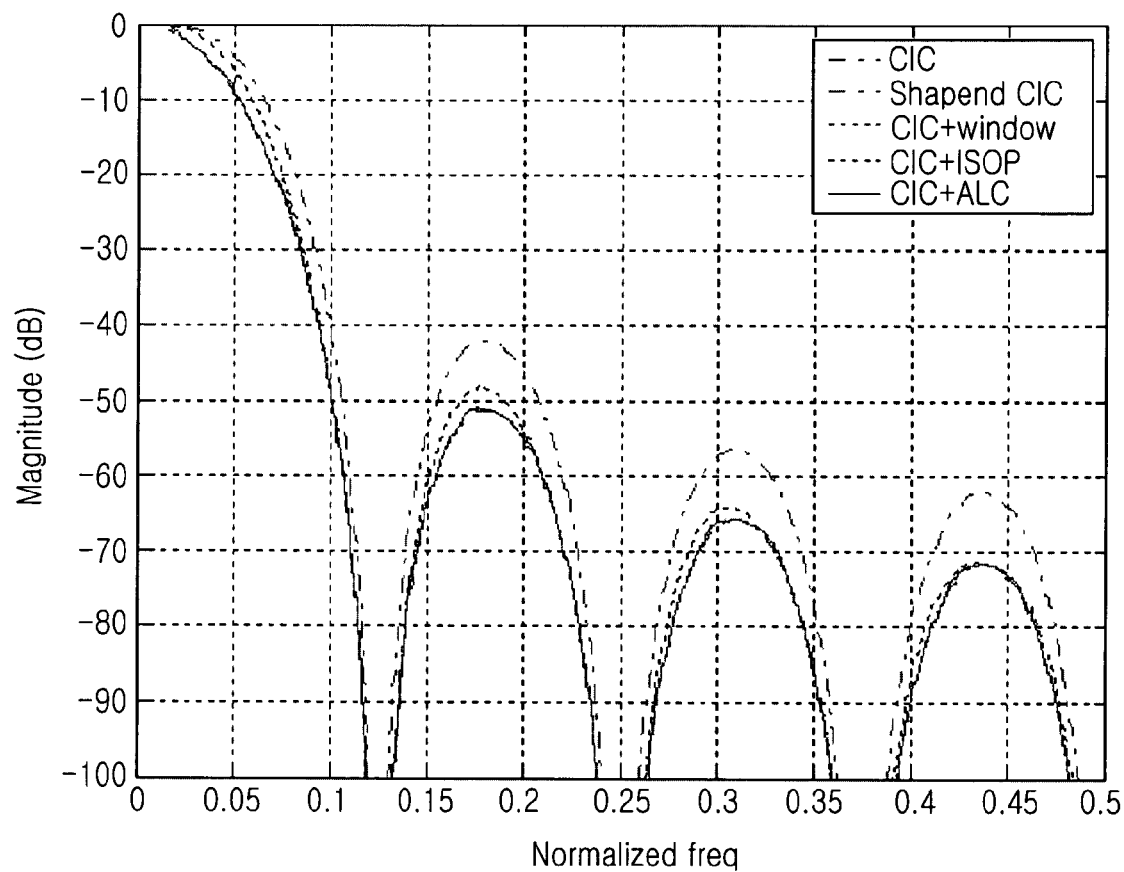
FIGS. 13A, 13B, and 14 are graphs showing simulation results of the decimator of the present invention and the conventional CIC decimation filter under a decimation ratio of 8:1.
Figure 13B:
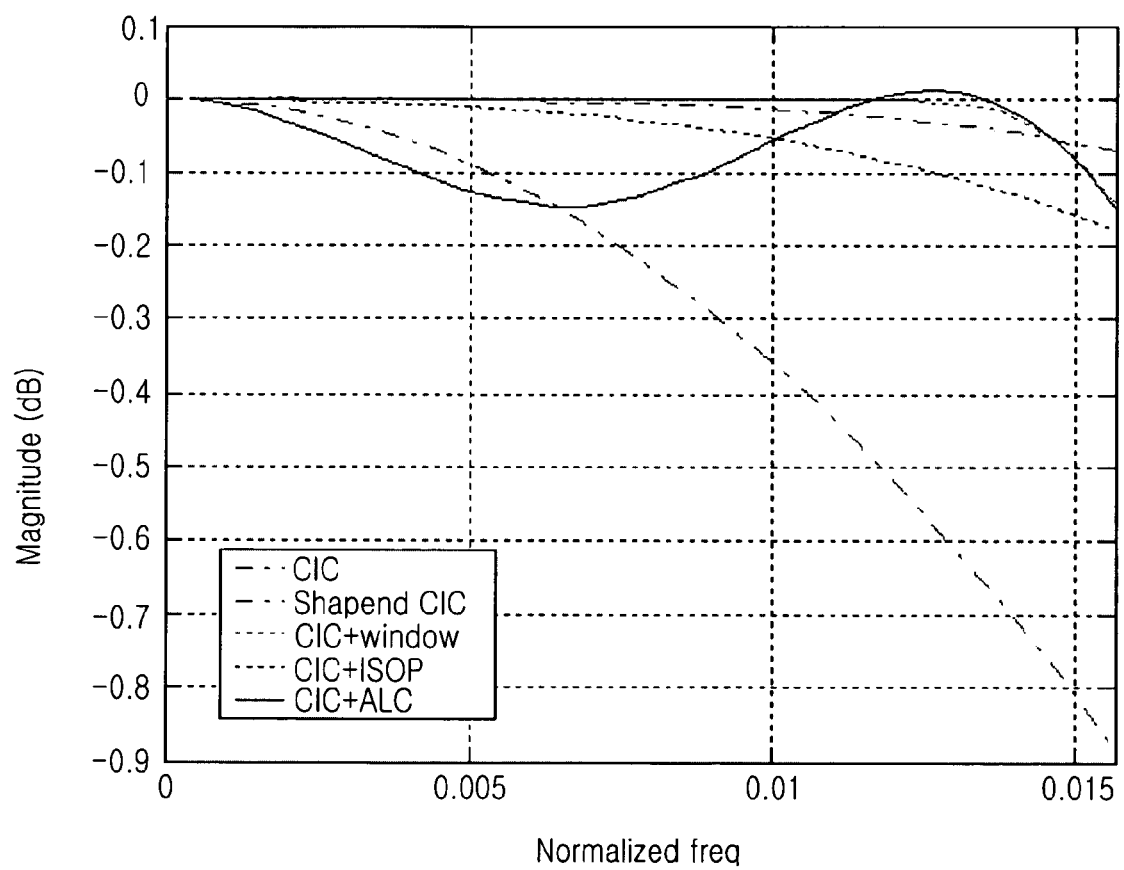
Figure 14:
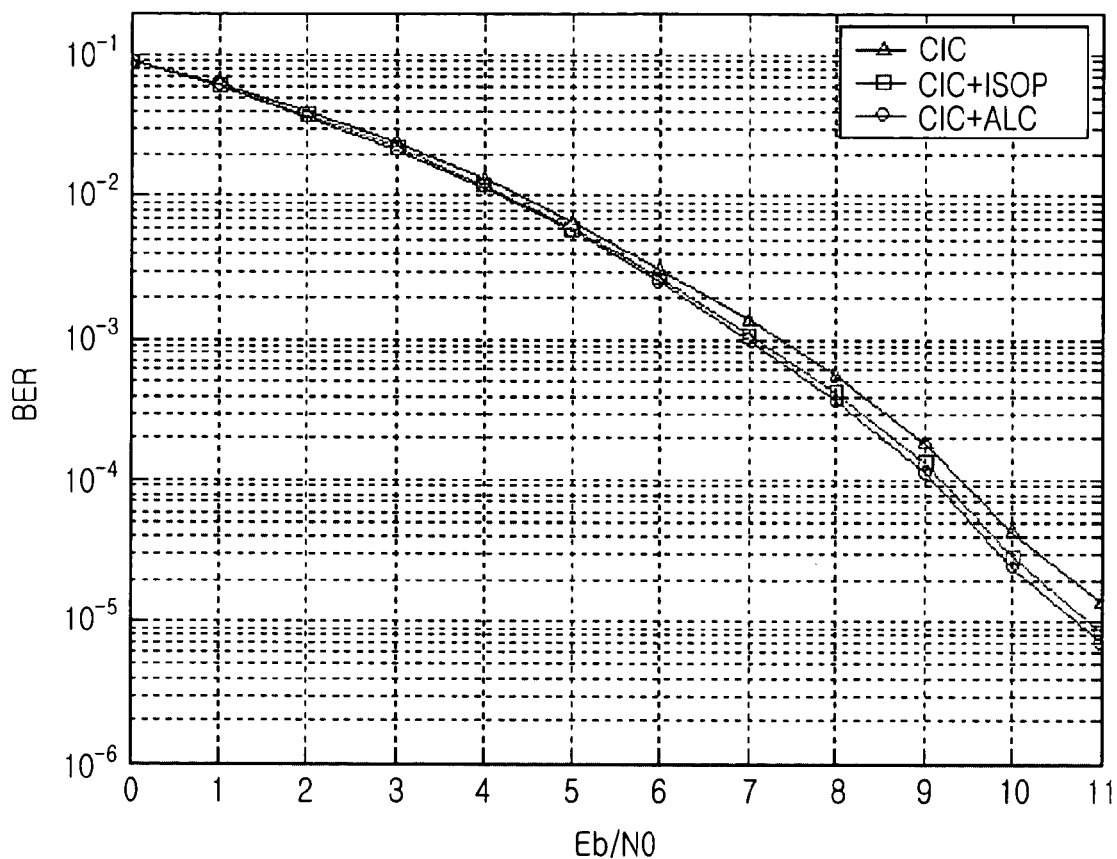

FIGS. 13A, 13B, and 14 are graphs showing simulation results of the decimator of the present invention and the conventional CIC decimation filter under a decimation ratio of 8:1.

That is, FIGS. 13A and 13B are graphs showing frequency response characteristics of the decimation filter of the present invention and the conventional CIC decimation filter, comparing their magnitudes. FIGS. 13A and 13B shows not only the compensation results caused by the decimator employing the decimation filter of the present invention and a decimator employing the conventional CIC decimation filter, but also the compensation results caused by a second-order sharpened CIC decimation filter, a CIC compensation filter using a window method, and a CIC compensation filter using ISOP.

From the viewpoint of performance in a passband, the sharpened CIC decimation filter shows the smallest attenuation, the attenuation is smaller and smaller in the order of the window-designed CIC compensation filter, the decimation filter of the present invention, and the CIC compensation filter using ISOP.

In a stopband, the compensation method using the decimation filter of the present invention causes the greatest attenuation, while the performance of the sharpened CIC decimation filter is deteriorated. With respect to attenuation of the aliasing components, the conventional CIC decimation filter has the best performance, the decimation filter of the present invention and the window-designed CIC compensation filter are superior to any other filter except for the conventional CIC decimation filter, and the sharpened CIC decimation filter shows an inferior performance by 7 to 8 dB.

When a fourth-order sharpened CIC decimation filter is employed, it causes the best efficiency in the aliasing and stopband attenuations, but a stopband drop does not satisfy the demand conditions of the present invention and a large number of operations are required, so that a second-order filter is employed in the embodiments of the present invention.

From the viewpoint of the number of operations, the ISOP filter has the simplest structure, but it is located at the stage following to a CIC decimation filter and must operate at a frequency of Fs/8. Therefore, the compensation method using the decimation filter of the present invention, which operates at a frequency of Fs/32 in a baseband, requires the least number of operations, thereby having the best performance. Also, from the viewpoint of memory usage, the compensation method of the present invention requires only two taps at the final terminal of the decimator, that is, of the digital down-converter, thereby requiring the least amount of memory. However, from the viewpoint of the phase characteristic of a filter, the compensation method of the present invention has a group delay of 0.1 sample in maximum due to its approximate linear form.

FIG. 14 is a graph showing simulation results of the decimation filter according to the method of the present invention and the ISOP filter, which provides high compensation performance and reduces the number of operations, under a white noise environment. The compensation method according to the decimation filter of the present invention has an approximate linear characteristic, and also exhibits an improved performance of about 0.2 dB, as compared with the compensation method using the conventional CIC decimation filter.

According to the digital sampling rate converter of the present invention, since an approximate linear compensation filter is constructed as a second-order structure for processing signals of a baseband of the digital down/up converter (decimator/interpolator), it is possible to operate at a clock rate of the lowest frequency, and only a two-tap memory is required, so that there is an it is able to operate at a low speed, with a small number of operations, and using few resources.

While the present invention has been shown and described with reference to certain preferred embodiments thereof, it will be understood by those skilled in the art that various changes in form and details may be made therein without departing from the spirit and scope of the invention as defined by the appended claims.

What is claimed is:

1. A digital sampling rate converter for compensating for a drop of an in-band signal, the digital sampling rate converter comprising:
   a CIC (Cascaded Integrator-Comb) decimator for performing a decimation operation on an input signal at a first decimation ratio based on an overall decimation ratio;
   a sub-decimator for performing a decimation operation at a second decimation ratio on a signal output from the CIC decimator; and
   a compensation unit for performing at least two multiplication operations and two addition operations on a signal output from the sub-decimator in an assigned band,
   wherein the compensation unit compensates for an attenuation of a frequency response characteristic having a sinc function form and an approximate linear phase characteristic.

2. The digital sampling rate converter of claim 1, wherein compensation filter coefficients $c_0$ and $c_1$ of the compensation unit are determined by the following equation so as to satisfy the attenuated frequency response characteristic and the approximately linear phase characteristic If $E_M(c) > \varepsilon$, $\underset{c}{\text{minimize}} \, E_M(C)$, and if not, $\underset{c}{\text{minimize}} \, E_G(C)$, where, $E_M(c) = \max|e_M(c)| - \min|e_M(c)|$,
$E_G(c) = \max|e_G(c)| - \min|e_G(c)|$,
$E_M(c, \omega_i) = |H(\omega_i)H_{ALC}(c, \omega_i)|$,
$e_G(c, \omega_i) = -\dfrac{d < \{H(\omega_i)H_{ALC}(e, \omega_i)\}}{d\omega}$, and
$c = [c_0, c_1]$.

3. A digital sampling rate converter for compensating for a drop of an in-band signal, the digital sampling rate converter comprising:

a compensation unit for performing at least two multiplication operations and two addition operations on an input signal using an operation clock frequency;

an interpolator for interpolating at a first interpolation ratio based on an overall interpolation ratio on a signal output from the compensation unit; and a CIC (Cascaded Integrator-Comb) interpolator for interpolating a signal output from the interpolator at a second decimation ratio.

* * * * *

UNITED STATES PATENT AND TRADEMARK OFFICE
CERTIFICATE OF CORRECTION

PATENT NO.         : 7,035,888 B2
APPLICATION NO. : 10/951249
DATED              : April 25, 2006
INVENTOR(S)       : Kyu-Ha Lee It is certified that error appears in the above-identified patent and that said Letters Patent is hereby corrected as shown below:

Title page, item (54) Title

"DIGITAL SAMPLING RATE CONVERTER FOR COMPENSATION FOR DROP OF IN-BAND SIGNAL"

should be

--DIGITAL SAMPLING RATE CONVERTER FOR COMPENSATING FOR DROP OF IN-BAND SIGNAL--

Signed and Sealed this

Twelfth Day of December, 2006

JON W. DUDAS
*Director of the United States Patent and Trademark Office*